(12) United States Patent
Kumar et al.

(10) Patent No.: US 11,080,444 B1
(45) Date of Patent: Aug. 3, 2021

(54) CONCURRENT FAULT CO-SIMULATOR

(71) Applicant: Cadence Design Systems, Inc., San Jose, CA (US)

(72) Inventors: Manoj Kumar, Westford, MA (US); David J. Roberts, Hollis, NH (US); Apurva Kalia, Lexington, MA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/712,938

(22) Filed: Dec. 12, 2019

(51) Int. Cl.
*G06F 30/3308* (2020.01)

(52) U.S. Cl.
CPC ............... *G06F 30/3308* (2020.01)

(58) Field of Classification Search
CPC .................................. G06F 30/3308
See application file for complete search history.

(56) References Cited

U.S. PATENT DOCUMENTS

2002/0188892 A1* 12/2002 Lajolo .............. G01R 33/18 714/42
2019/0095298 A1* 3/2019 Fricano ............ G06F 30/33

* cited by examiner

*Primary Examiner* — Vuthe Siek
(74) *Attorney, Agent, or Firm* — Schwegman Lundberg & Woessner, P.A.

(57) ABSTRACT

Devices, methods, computer-readable media, and other embodiments are described for concurrent functional and fault co-simulation of a circuit design. One embodiment involves accessing simulation data for a circuit design made up of a plurality of machine regions. A plurality of faults is selected from the simulation data for co-simulation operations of functional simulation and fault simulation of the circuit design, and functional simulation of the plurality of machine regions is initiated using the simulation data. A first machine region is identified during the functional simulation as associated with at least a first fault of the plurality of faults. A functional simulation of the first machine region is performed, and a divergence point associated with the first fault is identified. A fault simulation for the first fault is performed using the functional simulation of the first machine region and the divergence point.

20 Claims, 9 Drawing Sheets

CONCURRENT FAULT CO-SIMULATOR

TECHNICAL FIELD

Embodiments described herein relate to electronic design automation (EDA), and to systems, methods, devices, and instructions for automatic gate-level functional safety (FS) analysis and failure mode, effect, and diagnostic analysis (FMEDA) during design and creation of circuits and circuit designs.

BACKGROUND

Electronic design automation (EDA) is a category of systems for assisting with the design of electronic systems and devices. Large, integrated circuit designs are often assembled from previously designed blocks. This enables reduced turnaround times for generation of an integrated circuit. Automated design of routing connections between individual circuit elements or design blocks are also part of such EDA system operations. Schematic and layout information for such block portions of a design may be exchanged or licensed as intellectual property.

BRIEF DESCRIPTION OF THE DRAWINGS

Various ones of the appended drawings merely illustrate example embodiments of the present disclosure and should not be considered as limiting its scope.

DETAILED DESCRIPTION

Embodiments described herein relate to electronic design automation (EDA) and to methods, computer media, and devices used for analyzing, optimizing, and creating electronic circuits using functional simulation with concurrent fault co-simulation of a circuit design.

Various embodiments include a concurrent fault co-simulator with functional verification to improve the performance of verification operations above what currently exists for separate fault simulation and functional verification systems, which involve creation of complex independent verification environments, which is time consuming and complex for a functional safety verification engineer. Embodiments described herein improve the operations of EDA systems and devices by reducing overall computation resources and time needed for combined functional and fault verification, as well as simplifying the set-up for the combined operations. In particular, processing resources can be conserved in various embodiments by using shared portions of a verification for function and fault analysis, and computing a fault analysis based on a difference with the functional analysis to avoid duplicating calculations that are shared between functional and fault verification operations. This can be done by identifying divergence points between functional and fault analysis for machine regions of a circuit design.

Figure 1:
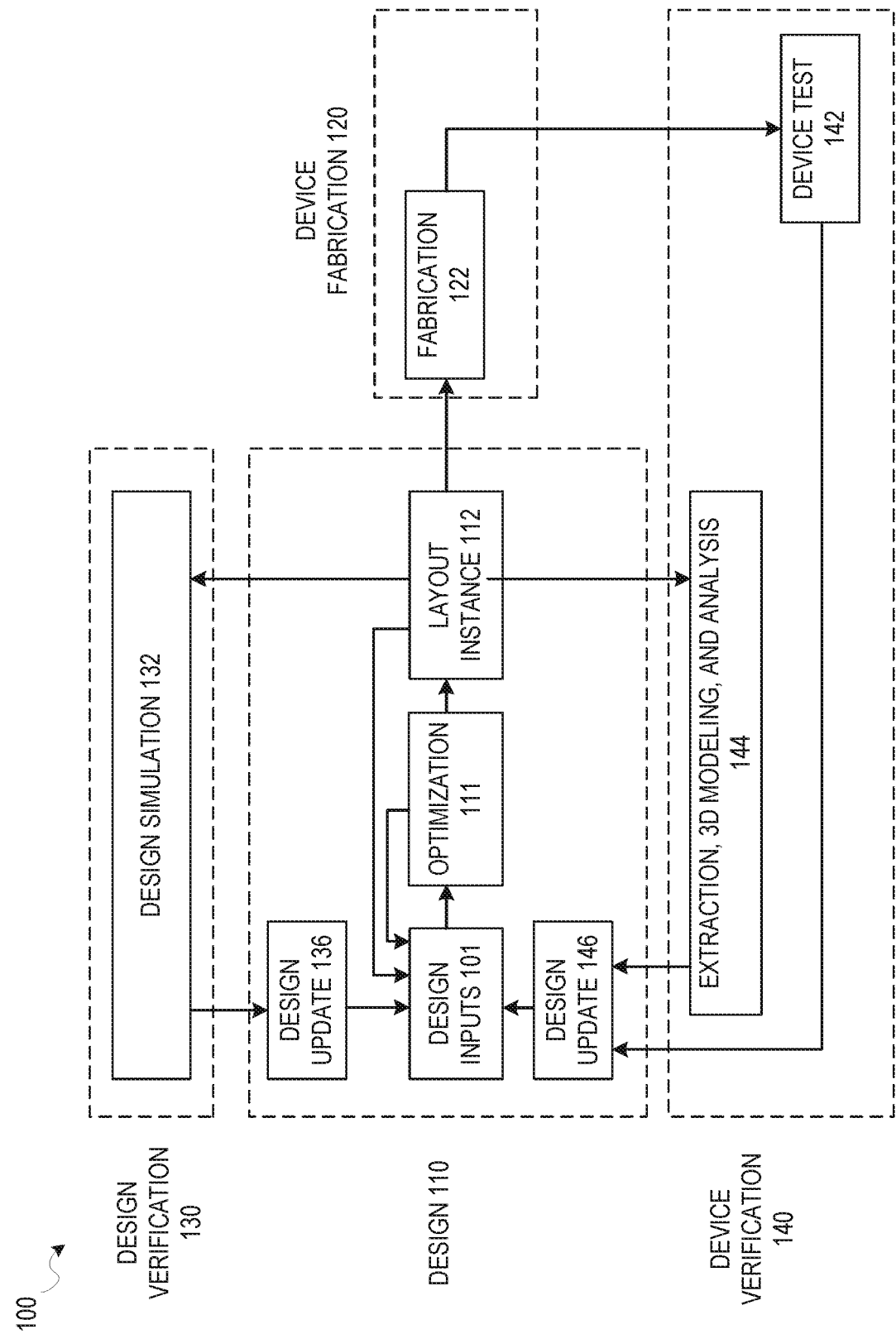
FIG. 1 is a diagram illustrating aspects of one possible design process flow, in accordance with some embodiments.

FIG. 1 is a diagram illustrating one possible design process flow which may be enhanced by functional simulation with concurrent fault co-simulation. As described herein, the standard process flows of FIG. 1 include design simulation 132. Design simulation 132 can include separate functional simulation of the circuit design, along with fault simulation, particularly for systems with functional safety standards applied. By integrating fault simulation and functional simulation, aspects of design simulation 132 can be accelerated and improved.

As illustrated, the overall design flow 100 includes a design phase 110, a device fabrication phase 120, a design verification phase 130, and a device verification phase 140. Each of these phases may include functional safety design operations. The design phase 110 involves an initial design input operation 101 where the basic elements and functionality of a device are determined, as well as revisions based on various analyses and optimization of a circuit design. This design input operation 101 is where initial layouts for a circuit are generated before adjustments are made to ensure that functional requirements of the circuit are met. The initial strategy, tactics, and context for the device to be created are also generated in the design input operation 101, depending on the particular design algorithm to be used. Integration of functional safety with a design flow enables functional safety data to be input as part of an initial set of design inputs in design input operation 101.

In some embodiments, following an initial selection of design values in the design input operation 101, updates to an initial circuit design may be generated, in accordance with various embodiments described herein, during an optimization operation 111 or a layout instance 112, along with any other automated design processes. As described below, design constraints for a circuit design may be initiated with design inputs in the design input operation 101, and then may be analyzed using a timing analysis, according to various embodiments. While the design flow 100 shows optimization occurring prior to the layout instance 112, updates to a circuit design may be performed at any time to improve expected operation of a circuit design. Use of specialized synthesis operations with mapped functional safety information enables systems with less manual input and modification of functional safety detail. Integration of functional safety data with such a process also allows verification of functional safety requirements, including verification operations as part of a design verification phase 130 and design simulation 132 both to confirm normal operation of a circuit design and to confirm functional safety specifications are met in failure (e.g. fault) cases. For example, if a fault analysis determines that a redundancy element is needed for functional safety metrics to be met, an automated EDA option is available to automatically insert the redundancy following a fault verification, with the circuit automatically changed to include the redundancy, and with associated verification steps to confirm that the automated adjustment does not violate other functional or safety criteria of the circuit design. In various embodiments, functional and safety constraints for blocks in a circuit design may be generated prior to routing of connections in a circuit design, after routing, during register transfer level (RTL) operations, or as part of a final signoff optimization or verification prior to a device fabrication operation 122. Certain embodiments of operations described herein for generating and updating a circuit design and verifying the updated circuit design using functional safety data may therefore involve iterations of the design input operation 101, optimization operation 111, and layout instance 112 generation. In other systems, other design processes may be used.

After design inputs are used in the design input operation 101 to generate a circuit layout, and any optimization operations 111 are performed, a layout is generated in the layout instance 112. The layout describes the physical layout dimensions of the device that match the design inputs. This layout may then be used in the device fabrication operation 122 to generate a device, or additional testing and design updates may be performed using designer inputs or automated updates based on design simulation 132 operations or extraction, three-dimensional (3D) modeling, and analysis 144 operations. Once the device is generated, the device can be tested as part of device test 142 operations and layout modifications generated based on actual device performance.

Figure 2:
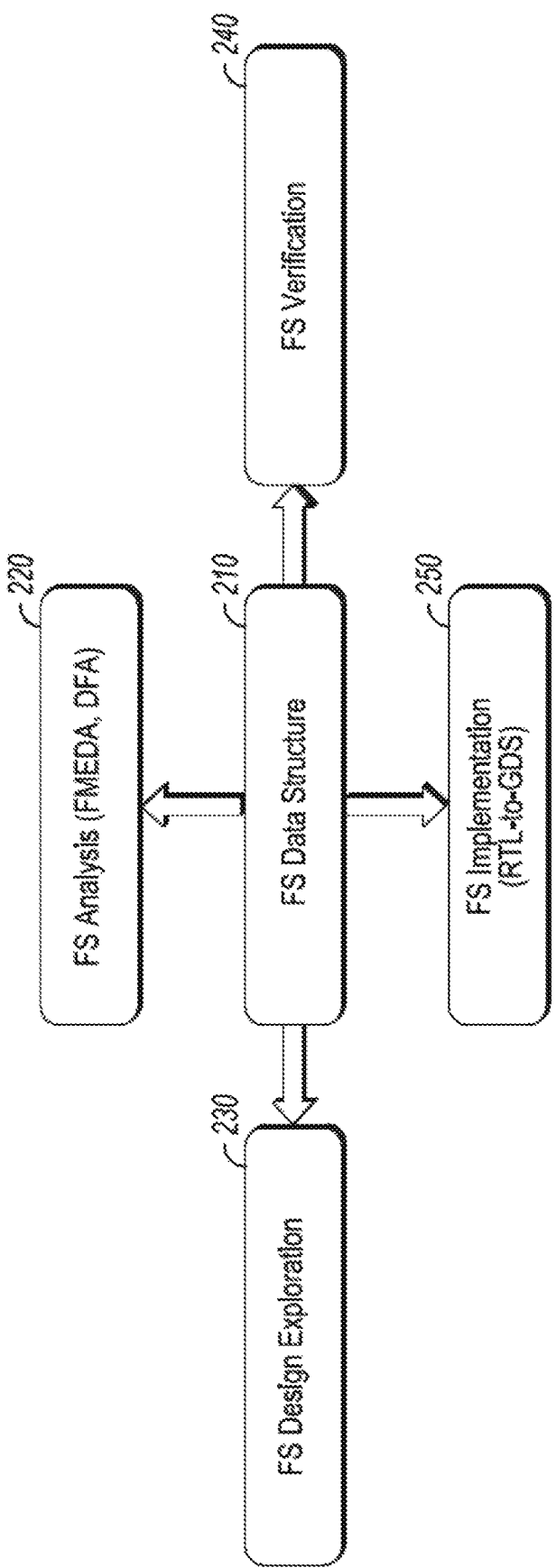
FIG. 2 illustrates aspects of functional safety (FS) analysis which may be integrated with a design process flow including a functional analysis and concurrent fault co-simulation in accordance with some embodiments described herein.
Figure 3:
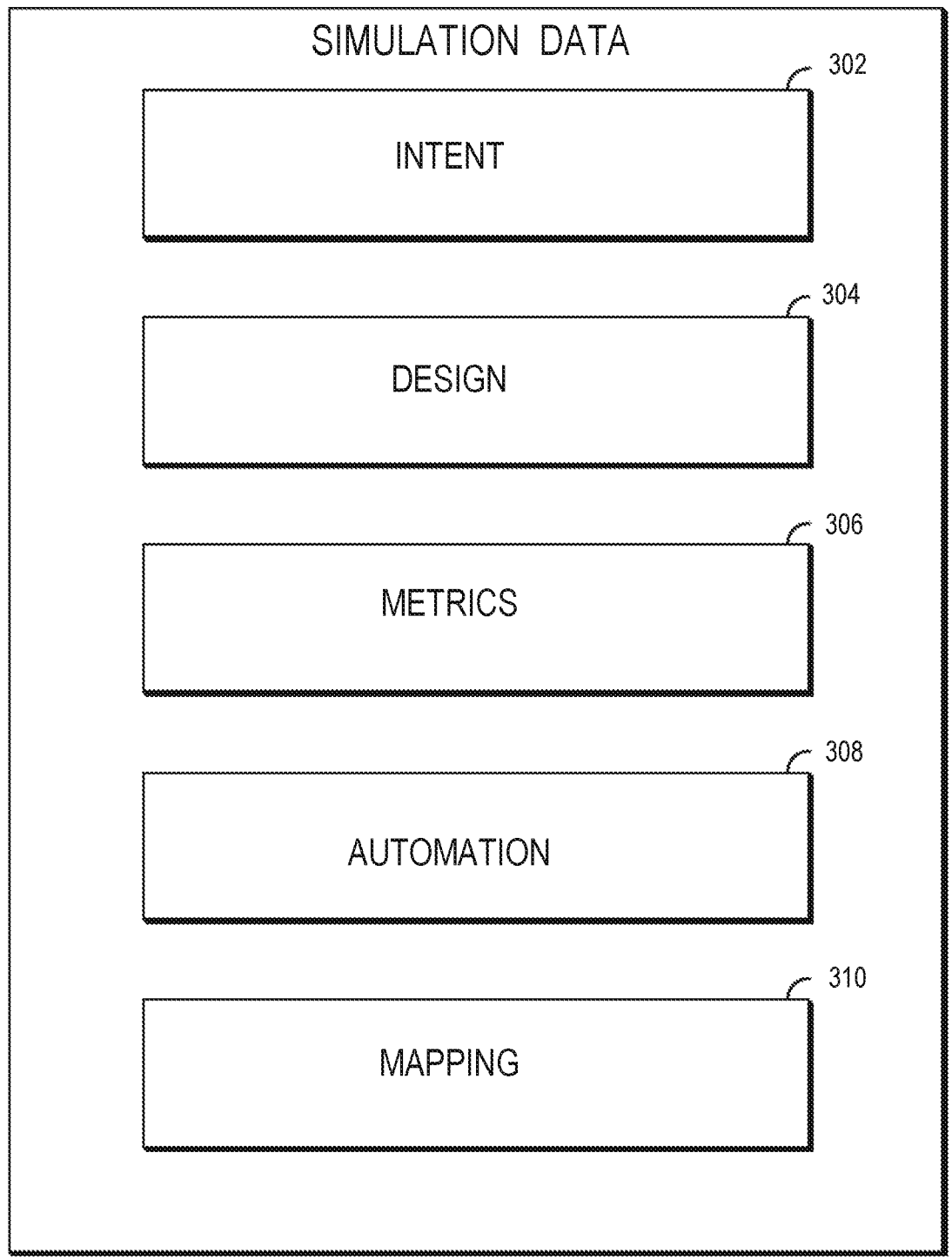
FIG. 3 illustrates aspects of simulation data which can be used with functional verification and concurrent fault co-simulation, in accordance with some embodiments.
Figure 4:
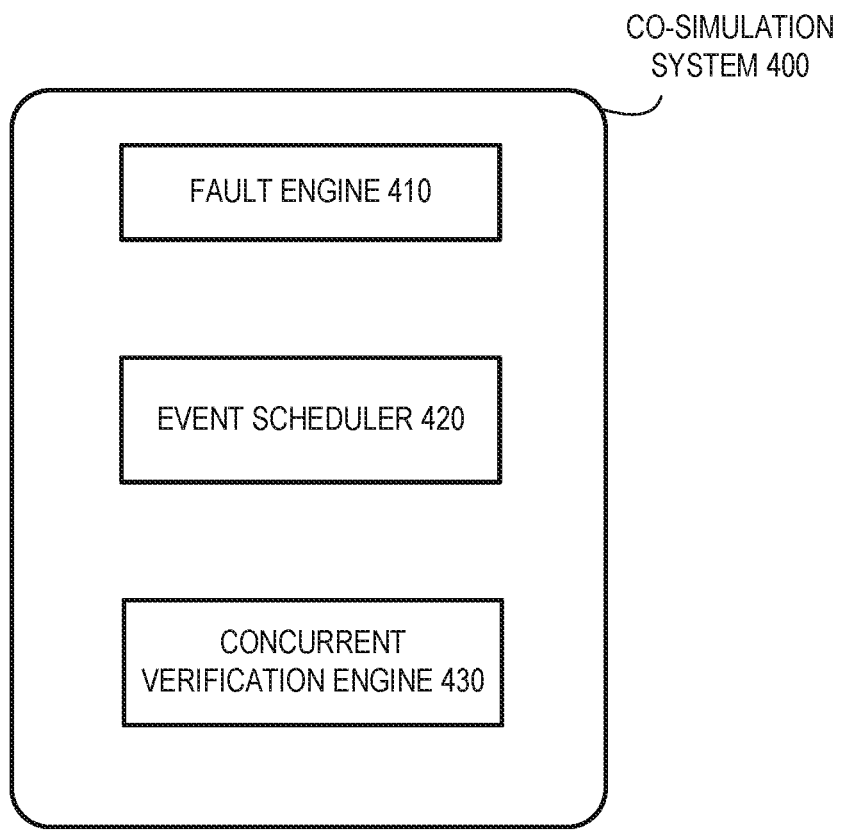
FIG. 4 illustrates aspects of functional verification with concurrent fault co-simulation in accordance with some embodiments described herein.
Figure 5:
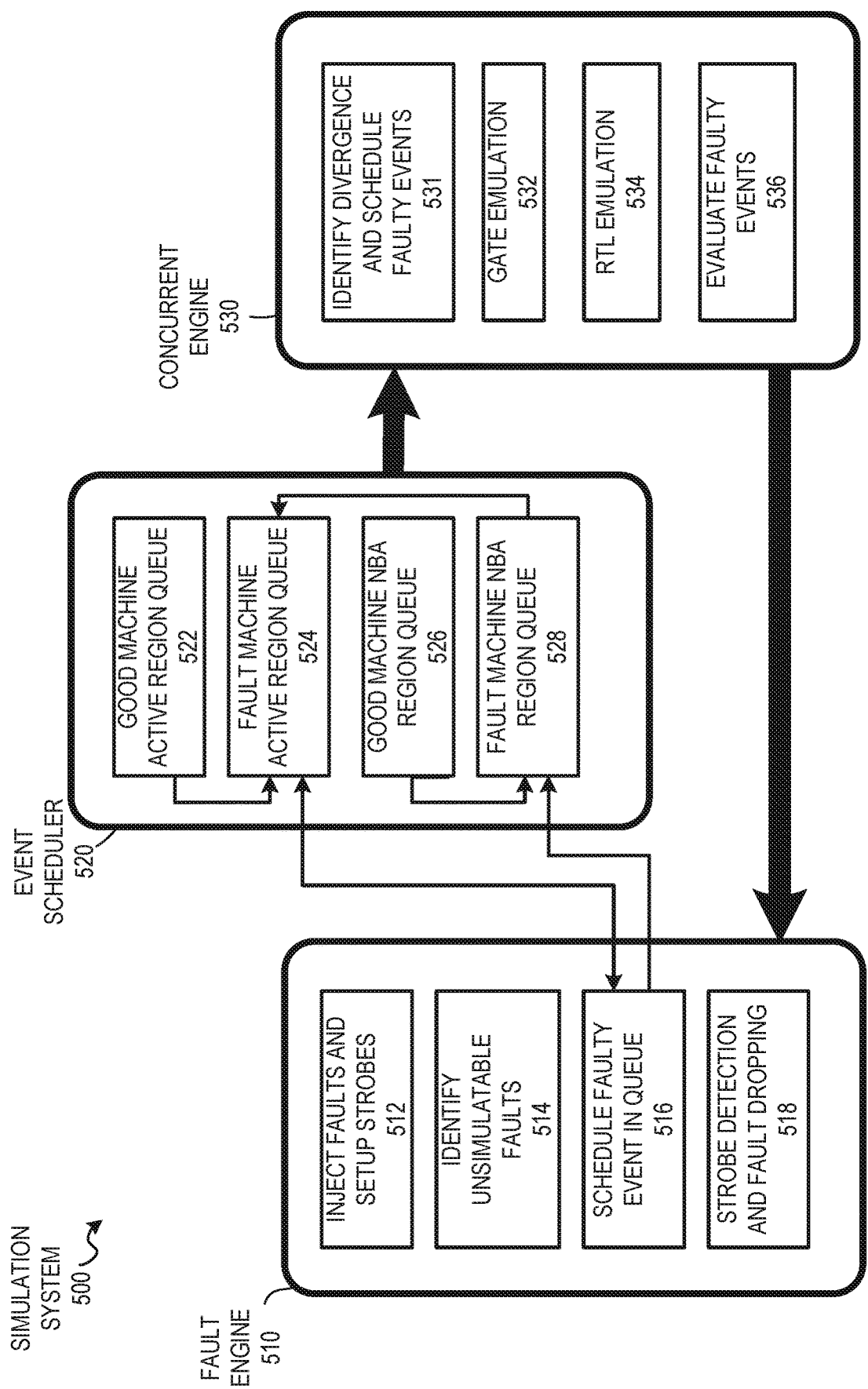
FIG. 5 illustrates aspects of functional verification with concurrent fault co-simulation in accordance with some embodiments described herein.

FIG. 2 then illustrates simulation data and FS operations that can be integrated into the process flow of FIG. 1 or any other such process flow, and FIG. 3 illustrates a particular design process flow with additional details for integration of safety design and verification into the process. FIG. 4 describes aspects of simulation data, and FIG. 5 illustrates an embodiment of fault co-simulation that can be included as part of verification 330 of FIG. 3.

To include functional safety in a design flow, technical safety design parameters (e.g., requirements) for a design are captured and evaluated using functional safety (FS) analysis. The FS analysis is then used to drive design exploration for hardware and software changes, as well as overall implementation and verification. The FS design exploration may start with an RTL of the circuit design, and explore hardware and software safety mechanisms to meet safety metrics, as well as adjusting various additional metrics such as size and verification time. FS implementation (e.g., synthesis) inserts safety mechanisms (e.g., additional circuitry or design changes) targeted to meet or improve FS criteria as well as adjusting the circuit design with layout measures dictated by FS procedures (e.g., FS-aware placement and routing). FS verification validates coverage estimation of safety mechanisms and may use fault injection analysis to model safety and failure modes of a device.

FIG. 2 illustrates aspects of functional safety (FS) analysis which may be integrated with a design process flow including a functional analysis and concurrent fault co-simulation in accordance with some embodiments described herein. FIG. 2 shows a simulation data structure 210 which includes simulation data that may be used in various design and analysis processes as part of a design flow. As illustrated by FIG. 2, data from simulation data structure 210 may be used by FS analysis operations 220, FS design exploration operations 230, FS verification operations 240, and FS implementation operations 250.

In FS integration with a design flow, technical safety requirements for a product (e.g., circuit, semiconductor device, etc.) are generated as part of the initial design description. In traditional FS processes, these requirements are evaluated using a manual FS analysis. One example is FMEDA, which is a systematic analysis technique to obtain subsystem and product level failure rates, failure modes, and diagnostic capabilities. Some such techniques may consider components of a system, functionality of each component, failure modes of each component, effects of each component failure mode on system operation, the ability of diagnostic components within the system to detect a failure, and various other system design metrics (e.g., operating conditions, safety and failure requirements, etc.). Given accurate input data, such a standardized analysis technique can predict system-level failure rates based on component data. Another example of a traditional FS process is DFA, which in some embodiments may be a subset of FMEDA analysis. DFA involves identification of redundancy of functionality that can reduce failures for independent failure modes, as well as identifying independent and dependent failure modes in a system. In various embodiments, such operations may be used to achieve FS goals for a design with automatic integration of design and verification operations in a process flow for a circuit design.

The simulation data structure 210 includes data that is provided by a designer as part of the circuit design goals. Simulation data structure 210 may be considered as including input data along with other circuit design data as part of a design input operation 101. The simulation data from simulation data structure 210 is then used in various other operations of the design flow such as the illustrated operations 220, 230, 240, and 250. For example, FS analysis operations 220 may use initial simulation data to generate additional simulation data values and may implement automated FS analysis operations using initial simulation data. FS design exploration operations 230 may include operations to analyze hardware and software safety mechanisms to meet associated safety metrics (e.g., FS criteria) in the context of particular circuit elements and circuit design combinations. The results may be used to generate FS reporting and to implement improvements in other operations. FS implementation operations 250 may include design flow operations to adjust a design by including additional hardware safety mechanisms (e.g., failure reduction or failure detection elements within a design). FS verification operations 240 may include operations to validate coverage estimation of both hardware and software safety mechanisms, and may include fault injection operations based on FS analysis operations 220 to analyze various faults and failure detection mechanisms for a design. In some embodiments, this may include DFA synthesis and automatic layout countermeasures implemented as safety mechanisms (SM) within a design. This may include automatic adjustment and analysis of a circuit translated from a register transfer level description to graphic database system (GDS, GDSII) data used to control integrated circuit photomask plotting for integrated circuit fabrication during design flow. In various embodiments, different levels of detail and types of data may be used as inputs to the simulation data structure 210 to be used by these FS operations. Additional examples of simulation data structures 210 are described below in FIGS. 3 and 4.

These data structures may be used to verify and improve a design. Functional safety within a process flow uses reliability and failure rate information, information about available safety mechanisms (e.g., software safety, hardware safety, built-in self-test (BIST), etc.) to prevent and detect faults, and information about diagnostic coverage in a design that indicates how well mechanisms detect faults. This FS information may be used to improve a design by identifying better components and better or supplemental safety mechanisms that may be included in design updates. This also may be used to generate standardized functional safety analysis and reporting (e.g., SPFM, LFM, FIT, etc.) to provide FS context for the overall design and any design improvements made during the design process flow.

In a design-for-safety process flow, the safety process can introduce simulation data for attribute definition and mapping within the design to be considered throughout the design process. It enables initial identification of safety intent as an input to EDA design operations, with automatic EDA consideration of failure modes (FM) and safety mechanisms (SM). In some embodiments, safety reporting aligned with safety standards (e.g., automotive, medical, etc.) may be included to match application requirements of a particular circuit design. In some embodiments, standard or required SM, DFA countermeasures, or fault injection testing for diagnostic coverage set by FA design criteria or standardized device criteria for an application may be integrated with the EDA process flow. Such a process can use FS design mapping information as user inputs from a designer and captured and integrated with initial circuit design information to be structured for use by the EDA process flow as simulation data authoring and quality checking.

Synthesis operations as part of a FS aware design flow may include insertion of design elements within the overall circuit design to meet FS criteria or improve FS performance. Synthesis operations can involve mapping between design phases, with modifications managed as part of the synthesis operations.

After synthesis operations to include any insertion of FS mechanisms within a design, the initial design data and the updated design data (e.g., including updated gate-level netlists and updated simulation data reflecting FS information associated with the inserted FS mechanism(s)) are used for various operations such as equivalence checking and verification to confirm that the elements were added to the design correctly without generating problems with the circuit design.

Verification is structured not only as "good machine" verification (e.g., verification of a circuit design simulated as if it contains no faults), but also "fault machine" verification (e.g., verification with the circuit design modified to include a fault or failure in accordance with functional safety or other design flow operations). Additional aspects of co-simulation of "good machine" and "fault machine" versions of regions of a circuit design are described in detail below in FIGS. 4-7. The results of such verification operations can be structured as FS reporting, or as any such output of a functional safety result that can be reported or automatically integrated to update a verification test bench (e.g., configuration of verification operations) or aspects of a circuit design (e.g., by modifying a machine region to address functional safety requirements associated with a fault).

Once the updated and verified design data is generated with expected operations for additional iterations or updates, the updated design data is used for place and route operations. In some embodiments, FS-aware placement and routing with rules to reduce common cause failures and cascading failures are used, with associated FS reporting based on routing and placement failure risks (e.g., DFA reporting). This results in output circuit design data, which includes physical layout circuit design data (e.g., GDSII data) combined with output simulation data. This output circuit design data may then be used for physical sign-off operations, with associated output FS reporting. This may include any analysis and checks of the final output design against input FS criteria, such as expected specific failure criteria which limits expected failure rates or sets reporting and response criteria for failures. In some embodiments, physical sign-off operations output data files which may be used by fabrication hardware to generate a physical semiconductor circuit from the output circuit design data.

FIG. 3 illustrates aspects of simulation data which can be used with functional verification and concurrent fault co-simulation, in accordance with some embodiments. The example simulation data 300 includes intent data 302, design data 304, metric data 306, information for automation data 308, and design mapping data 310. Intent data 302 may reflect the safety and reliability criteria set by a designer for a circuit design. Design data 304 and safety metric data 306 may reflect various aspects of a circuit design as well as elements of functional safety performance (e.g., a list of faults to be simulated using the design) of the circuit elements of a design as arranged in a particular circuit design. Intent data 302, design data 304, and safety metric data 306 can reflect FMEDA report data, which may be combined with information for automation data 308 to enable automated EDA to modify a design based on improvements to a circuit design identified during fault verification. For example, associating blocks of data with particular allowed automated improvements, identifying automation to adjust problematic routing and placement from a FS perspective that may otherwise meet device performance criteria, or other such data may be identified as part of the information for automation data 308. Design mapping data 310 then tracks user and system updates to a circuit design to map EDA operations.

FIG. 4 illustrates aspects of functional verification with concurrent fault co-simulation in accordance with some embodiments described herein. FIG. 4 shows an overview of co-simulation system 400. Co-simulation system 400 operates in a space of complex test benches for verification of a circuit design (e.g., verification 330, design verification phase 130 and design simulation 132, etc.). Such verification test benches are configured by functional safety verification engineers to confirm functional safety compliance for a device, and given the possible complexity of failures for complex circuit designs, the functional safety verification operations can be more complex than the circuit design.

Standard simulation approaches either run serial fault simulation independent of the functional simulation, or perform a capture and replay analysis by capturing a boundary stimulus and replaying the captured waveform in a subsequent machine analysis. Serial fault simulation uses a single fault per simulation run, and under stringent functional safety standards, can result in thousands or millions of verification runs using large amounts of processing time with significant redundancies in repeated runs. The capture and replay analysis uses two analysis procedures per fault to capture the stimulus and a boundary of the device (e.g., machine or circuit design) being tested, and a second analysis to replay the captured waveform. Such capture and replay analysis involves complex user interactions to modify test scripts in capturing a stimulus and maintaining a stimulus for safety verification. The manual aspects of such analysis are error prone, and unable to react to or accommodate changes in fault behavior.

Co-simulation system 400 includes fault engine 410, event scheduler 420, and concurrent verification engine 430. While these elements are described independently for the purposes of explanation, it will be apparent that these elements can be integrated or configured together in various ways in different embodiments. Concurrent verification engine 430 performs functional verification including parsing and elaboration of standard functional simulation of machine regions (e.g., portions of a circuit design). At runtime, concurrent verification engine 430 interacts with fault engine 410 to perform fault analysis as part of functional safety verification. Event level congruency is maintained between the fault engine 410 and concurrent verification engine 430 using event scheduler 420 to allow a single simulation system 400 to perform both functional and fault simulation. This congruency means that machine regions being analyzed at a given time have functional analysis performed followed immediately by fault analysis. If multiple machine regions are involved with a particular fault or blocking operations are present, the analysis of the associated machine regions can be managed by interactions between these elements to schedule the blocking operations appropriately so the needed information is present for a particular fault analysis.

FIG. 5 illustrates aspects of functional verification with concurrent fault co-simulation in accordance with some embodiments described herein. Simulation system 500 of FIG. 5 is one potential embodiment of simulation system 400.

As shown in FIG. 5, event scheduler 520 includes duplicate queues for functional simulation (e.g., good machine region analysis) and fault simulation (e.g., fault machine region analysis). The functional simulation queues are good machine active region queue 522 and good machine non-blocking assignment (NBA) region queue 526. The fault simulation queues are fault machine active region queue 524 and fault machine NBA region queue 528. Separate queues are also maintained for active regions, which can have dependencies that delay or complicate the analysis of the regions, and NBA regions that do not have such dependencies or blocks. During analysis, a design can be segmented into regions (e.g., machine regions) to simplify the analysis. Separating such queues enables a simplified organization of access to the emulators used to perform the verifications, and to maintain concurrency between the functional and fault verifications for a given machine region.

During simulation, a particular machine region being analyzed is checked for association with one or more faults by fault engine 510. When faults for a given region are identified, operation 512 injects the faults (e.g., modify a design with a particular fault) and places strobes. A strobe refers to an analysis point to determine the impact of a fault on the simulated operation of the machine region and circuit design. The faults can also be analyzed in operation 514 to determine if any of the faults cannot be simulated by the existing test bench. This can result in a user interface alert to an engineer indicating details of the unsimulatable fault, and may, in some embodiments, recommend or implement test bench changes for such a fault. Fault engine 510 schedules fault analysis in the queues of event scheduler 520 as part of operation 516. Operation 518 can accept strobe data and determine if errors occur in a fault simulation or if additional strobes or fault verification operations are needed using functional safety output data from the fault analysis by concurrent engine 530.

After functional verification and all suitable fault verifications for a particular machine region are scheduled in event scheduler 520, concurrent engine 530 performs the concurrent verification operations (e.g., co-simulation). When concurrent engine 530 receives scheduled events for a region, divergence points distinguishing a particular fault from the "good" operation are identified, and all faults associated with the particular region are scheduled for analysis with the functional analysis as a difference (e.g., delta or change) from the analysis of the machine region without the fault in operation 531. The functional analysis for the machine region and any fault analysis uses gate emulator 532, RTL emulator 534, or any other such analysis tools to perform the functional and fault verification for the machine region together. This allows the calculators for such analysis which are the same to be reused, and other resources (e.g., data in memory, identical calculations, etc.) to be reused for the concurrent functional and fault analysis of the region. Following completion of the verification operations (e.g., via emulation, etc.) any faulty events are analyzed in operation 536, and feedback is provided to fault engine 510. Fault engine 510 can use this information for strobe data and to identify faults that were not properly analyzed (e.g., fault dropping). Such information can also be used for a functional safety output that is used for functional safety reporting (e.g., FMEDA reporting or other such FS reporting 332). In some embodiments, this information can be used to schedule an additional fault in fault machine active region queue 524 via fault engine 510 when a functional verification causes an event in the fault machine in concurrent engine 530.

Such a simulation system 500 enables a functional safety verification engineer to reuse existing functional verification environment structures for fault analysis and functional safety verification. This can reduce verification times and workload, improving the performance of EDA devices by reducing time for a combined functional verification and fault verification of a circuit design. The improved device efficiency can be provided by injection and co-simulation of thousands of faults in a single run of a circuit design through the simulation system 500. Because the fault verification is performed as a difference with the functional verification from divergence points rather than a completely new analysis for each fault, processing resource usage can be significantly reduced.

Additionally, the feedback in system 500 enables reactive test benches with information from faults visible in the system 500. The reactive feedback to the test bench (e.g., the configuration and system setup for a circuit design and particular machine regions of a circuit design) limit the added complexity which can be present in fault verification above the functional verification complexity.

Figure 6:
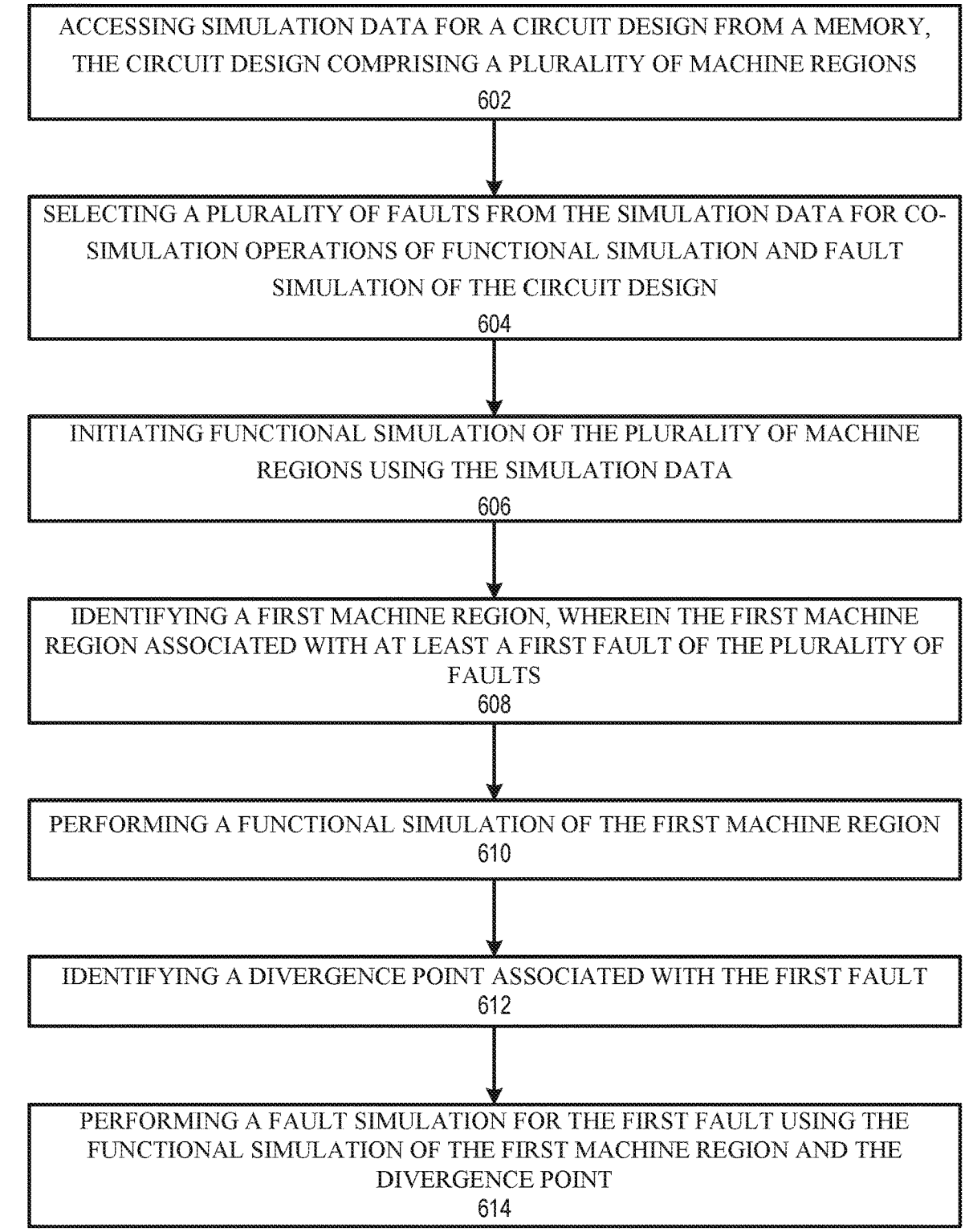
FIG. 6 illustrates a method for functional simulation with concurrent fault co-simulation in accordance with some embodiments described herein.

FIG. 6 then illustrates a method 600 for functional simulation with concurrent fault co-simulation in accordance with some embodiments described herein. The method 600 particularly describes one embodiment of a method for functional and fault co-simulation of a machine region of a circuit design. In some embodiments, the method 600 is performed by a computing device with one or more processors. In some embodiments, the method 600 is embodied in computer-readable instructions stored in a non-transitory storage device, such that when the instructions are executed by one or more processors of a device, the device performs the method 600. Other embodiments may be implemented using any acceptable format or instantiation.

Method 600 begins with operation 602 accessing simulation data for a circuit design from a memory. Such simulation data can be simulation data 300 of FIG. 3, or any other such configuration. The simulation data includes information on faults for the fault verification, and details of a circuit design such as machine regions of the circuit design that can be processed by emulators of a verification engine. This data can be stored in memory as part of another design process in a design flow which is accessed from the memory, or can be provided to the memory as an input by a functional safety verification engineer or other user as part of a design simulation portion of a circuit design process.

Faults are then identified and selected from the simulation data for co-simulation operations of functional simulation and fault simulation of the circuit design in operation 604. Such faults can be the faults that can be simulated by a particular simulation system, with non-simulatable faults identified and removed from a list of faults. In other embodiments, all faults are scheduled, with any issues verifying particular faults identified in functional safety output data.

As part of system operation, functional simulation of the plurality of machine regions is scheduled using the simulation data in operation 606, and in operation 608, at least a first machine region is identified as associated with a first fault. In various embodiments, all faults can be processed and associated with the corresponding machine region to allow the machine regions to be scheduled for concurrent analysis of each fault associated with a particular region. In operation 610, a functional simulation of the first machine region is performed. The data from this functional simulation can then be reused during fault verification for faults associated with the region. In method 600, this involves identifying a divergence point associated with the first fault in operation 612, and then in operation 614, performing a fault simulation for the first fault using the functional simulation of the first machine region and the divergence point. This functions to perform the fault simulation as a change or delta from the "good machine" functional verification.

Figure 7:
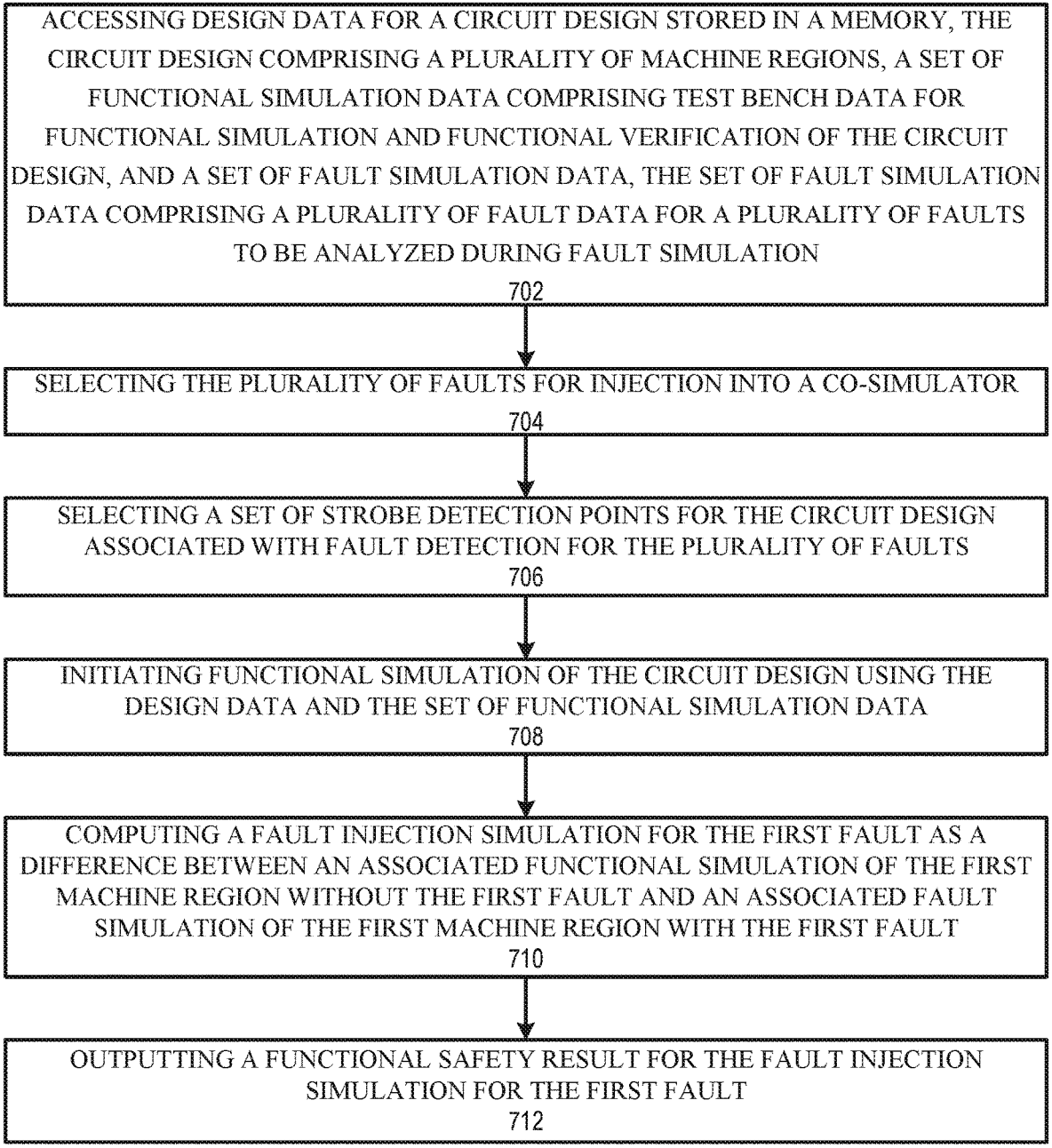
FIG. 7 illustrates a method for functional simulation with concurrent fault co-simulation in accordance with some embodiments described herein.

FIG. 7 then illustrates another method 700 for functional simulation with concurrent fault co-simulation in accordance with some embodiments described herein. The method 700 particularly describes one embodiment of a method for functional and fault co-simulation of a machine region of a circuit design. In some embodiments, the method 700 is performed by a computing device with one or more processors. In some embodiments, the method 700 is embodied in computer-readable instructions stored in a non-transitory storage device, such that when the instructions are executed by one or more processors of a device, the device performs the method 700. Other embodiments may be implemented using any acceptable format or instantiation.

Method 700 begins with accessing multiple types of data in operation 702. In various embodiments, data can be structured and accessed in different ways, but in operation 702, design data for a circuit design stored in a memory, a set of functional simulation data comprising test bench data for functional simulation and functional verification of the circuit design, and a set of fault simulation data are accessed. Such data can be generated separately by independent sources as part of a circuit design process, with the circuit design and associated machine regions defined during design steps and provided to a separate design simulation process. The test bench can be configured for a particular type of circuit design, and similarly the fault simulation data can be particular to an application associated with a circuit design (e.g., functional safety for transportation or health applications), the set of fault simulation data comprising a plurality of fault data for a plurality of faults to be analyzed during fault simulation.

Faults for injection into a co-simulator (e.g., concurrent engine 530) are then selected in operation 704. Additionally, in operation 706, a set of strobe detection points for the circuit design associated with fault detection for the plurality of faults is selected. The strobes are points in the verification operations that provide data as feedback for a designer to confirm that functional safety standards applied to a circuit design are met, and can also be used to provide reactive changes to a test bench or circuit design in response to verification results.

After the faults and associated strobes are selected, functional simulation is initiated using the design data and the set of functional simulation data in operation 708 for a first machine region of the plurality of machine regions, where the first machine region is associated with at least a first fault of the plurality of faults. Operation 710 is then the concurrent fault verification, with a fault injection simulation computed for the first fault as a difference between an associated functional simulation of the first machine region without the first fault and an associated fault simulation of the first machine region with the first fault. As described above, this allows the first fault to be simulated with minimal additional computing resources, and this can be repeated for each fault associated with the first machine region based on the differences in the operation caused by the fault. Following the functional simulation and the fault injection simulation, an output is generated in operation 712 of a functional safety result for the fault injection simulation for the first fault. This information can provide feedback to a designer, functional safety verification engineer, or other user via an EDA user interface. This information can also be aggregated with results for each fault to generate functional safety reporting or other such reporting as part of design compliance with functional safety standards, or can be used in any other such output.

While particular embodiments are described above, including ordered steps and placement of elements in various orders, it will be apparent that other embodiments may include repeated operations, or any number of intervening operations between the operations described.

Figure 8:
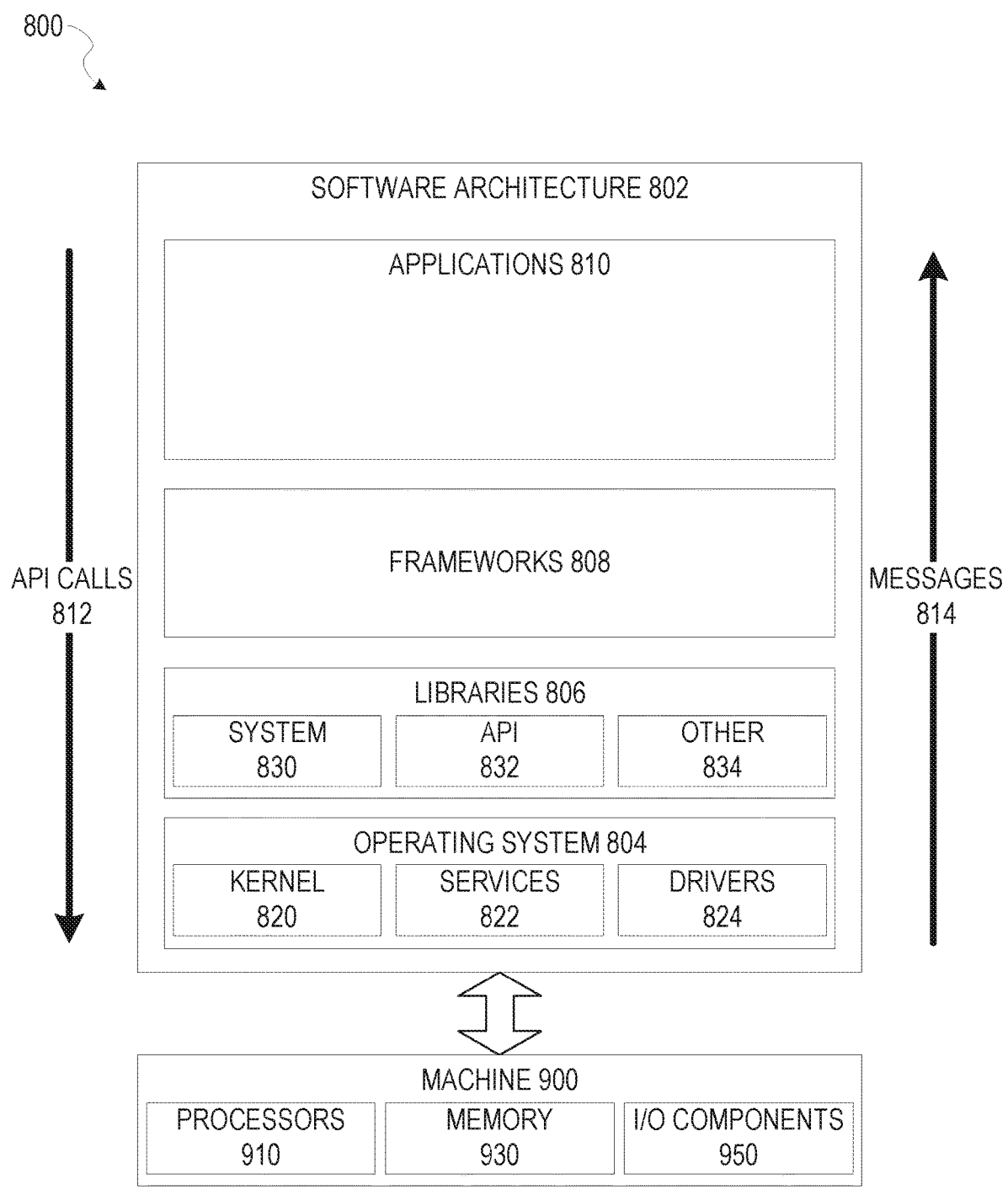
FIG. 8 is a block diagram illustrating an example of a software architecture that may be operating on an EDA computer and used with EDA methods of functional verification with concurrent fault co-simulation in accordance with some embodiments.

FIG. 8 is a block diagram 800 illustrating an example of a software architecture 802 that may be operating on an EDA computer and used with methods for concurrent fault co-simulation as described herein. The software architecture 802 can be used as an EDA computing device to implement any of the methods described above. Aspects of the software architecture 802 may, in various embodiments, be used to store circuit designs and FS data, as well as execute operations for design checks, verification, synthesis, placement and routing, physical sign-off, or any other such operations in an EDA environment to generate circuit designs, with physical devices generated using these circuit designs.

FIG. 8 is merely a non-limiting example of a software architecture 802, and it will be appreciated that many other architectures can be implemented to facilitate the functionality described herein. In various embodiments, the software architecture 802 is implemented by hardware such as a machine 900 that includes multi-core processors 910, memory 930, and I/O components 950. In this example, the software architecture 802 can be conceptualized as a stack of layers where each layer may provide a particular functionality. For example, the software architecture 802 includes layers such as an operating system 804, libraries 806, software frameworks 808, and applications 810. Operationally, the applications 810 invoke application programming interface API calls 812 through the software stack and receive messages 814 in response to the API calls 812, consistent with some embodiments. In various embodiments, any client device, server computer of a server system, or other device described herein may operate using elements of the software architecture 802. An EDA computing device described herein may additionally be implemented using aspects of the software architecture 802, with the software architecture 802 adapted for operating to perform EDA operations for concurrent fault co-simulation in accordance with embodiments described herein.

In one embodiment, an EDA application of the applications 810 performs operations for a design and verification process flow, according to embodiments described herein, using various modules within the software architecture 802. For example, in one embodiment, an EDA computing device similar to the machine 900 includes the memory 930, and one or more multi-core processors 910 are used to implement a process flow similar to process flow 300.

In some embodiments, an output module may be used to update a display of the IO components 950 of the EDA computing device with data associated with the updated circuit design and FS or fault data as part of operations of the process flow implemented as modules of applications 810. In various other embodiments, rather than being implemented as modules of one or more applications 810, some or all of the EDA modules implementing embodiments described herein may be using elements of the libraries 806 or the operating system 804.

In various implementations, the operating system 804 manages hardware resources and provides common services. The operating system 804 includes, for example, a kernel 820, services 822, and drivers 824. The kernel 820 acts as an abstraction layer between the hardware and the other software layers, consistent with some embodiments. For example, the kernel 820 provides memory management, processor management (e.g., scheduling), component management, networking, and security settings, among other functionality. The services 822 can provide other common services for the other software layers. The drivers 824 are responsible for controlling or interfacing with the underlying hardware, according to some embodiments. For instance, the drivers 824 can include display drivers, signal-processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 806 provide a low-level common infrastructure utilized by the applications 810. The libraries 806 can include system libraries 830 such as libraries of multi-instance blocks for use in an EDA environment or other libraries that can provide functions such as memory allocation functions, string manipulation functions, mathematic functions, and the like. In addition, the libraries 806 can include API libraries 832 such as media libraries (e.g., libraries to support presentation and manipulation of various media formats such as Moving Picture Experts Group-4 (MPEG4), Advanced Video Coding (H.264 or AVC), Moving Picture Experts Group Layer-3 (MP3), Advanced Audio Coding (AAC), Adaptive Multi-Rate (AMR) audio codec, Joint Photographic Experts Group (JPEG or JPG), or Portable Network Graphics (PNG)), graphics libraries (e.g., an OpenGL framework used to render in two dimensions (2D) and three dimensions (3D) in a graphic context on a display), database libraries (e.g., SQLite to provide various relational database functions), web libraries (e.g., WebKit to provide web browsing functionality), and the like. The libraries 806 may also include other libraries 834.

The software frameworks 808 provide a high-level common infrastructure that can be utilized by the applications 810, according to some embodiments. For example, the software frameworks 808 provide various graphic user interface (GUI) functions, high-level resource management, high-level location services, and so forth. The software frameworks 808 can provide a broad spectrum of other APIs that can be utilized by the applications 810, some of which may be specific to a particular operating system 804 or platform. In various embodiments, the systems, methods, devices, and instructions described herein may use various files, macros, libraries, and other elements of an EDA design environment to implement analysis described herein. This includes analysis of input design files for an integrated circuit design, along with any element of hierarchical analysis that may be used as part of or along with the embodiments described herein. While netlist files, library files, SDC files, and viewDefinition files are examples that may operate within a software architecture 802, it will be apparent that other files and structures may provide a similar function, in various embodiments.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various example embodiments, one or more computer systems (e.g., a standalone computer system, a client computer system, or a server computer system) or one or more hardware modules of a computer system (e.g., a processor or a group of processors) are configured by software (e.g., an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA) or an application-specific integrated circuit (ASIC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines 900 including multi-core processors 910), with these operations being accessible via a network (e.g., the Internet) and via one or more appropriate interfaces (e.g., an API). In certain embodiments, for example, a client device may relay or operate in communication with cloud computing systems, and may store media content such as images or videos generated by devices described herein in a cloud environment.

The performance of certain of the operations may be distributed among the processors, not only residing within a single machine 900, but deployed across a number of machines 900. In some example embodiments, the multi-core processors 910 or processor-implemented modules are located in a single geographic location (e.g., within a home environment, an office environment, or a server farm). In other example embodiments, the multi-core processors 910 or processor-implemented modules are distributed across a number of geographic locations.

Figure 9:
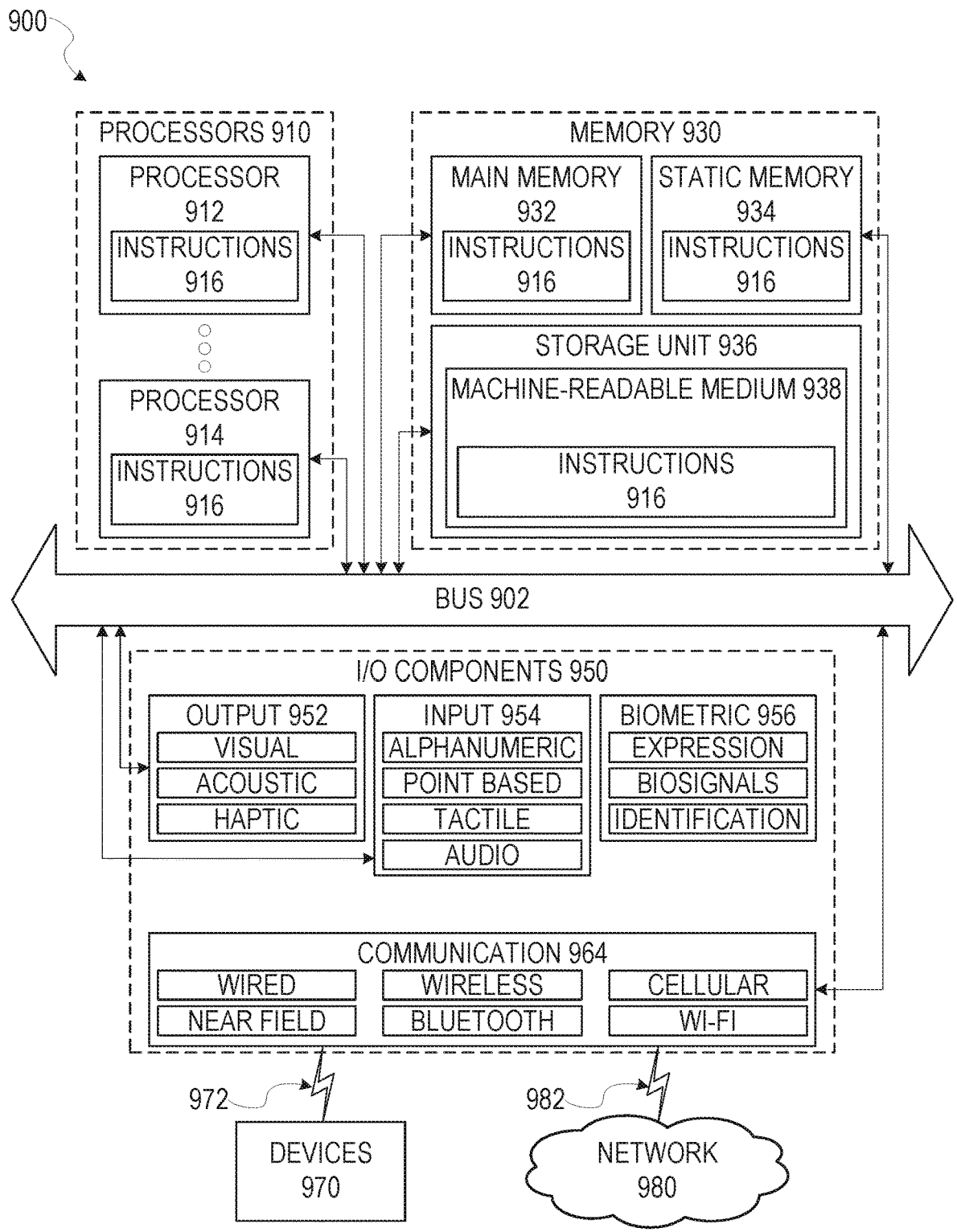
FIG. 9 is a diagrammatic representation of a machine in the form of a computer system within which a set of instructions are executed, causing the machine to perform any one or more of the methodologies discussed herein, according to some example embodiments.

FIG. 9 is a diagrammatic representation of the machine 900 in the form of a computer system within which a set of instructions may be executed for causing the machine 900 to perform any one or more of the methodologies discussed herein, according to an example embodiment. FIG. 9 shows components of the machine 900, which is, according to some embodiments, able to read instructions from a machine-readable medium (e.g., a machine-readable storage medium) and perform any one or more of the methodologies discussed herein. In some embodiments, the machine 900 may operate with instructions 916 (e.g., software, a program, an application, an applet, an app, or other executable code) for causing the machine 900 to perform any one or more of the methodologies discussed. In alternative embodiments, the machine 900 operates as a standalone device or can be coupled (e.g., networked) to other machines. In a networked deployment, the machine 900 may operate in the capacity of a server machine or a client machine in a server-client network environment, or as a peer machine in a peer-to-peer (or distributed) network environment. The machine 900 can comprise, but not be limited to, a server computer, a client computer, a personal computer (PC), a tablet computer, a laptop computer, a netbook, a set-top box (STB), a personal digital assistant (PDA), a media system, a cellular telephone, a smart phone, a mobile device, or any machine capable of executing the instructions 916, sequentially or otherwise, that specify actions to be taken by the machine 900. Further, while only a single machine 900 is illustrated, the term "machine" shall also be taken to include a collection of machines 900 that individually or jointly execute the instructions 916 to perform any one or more of the methodologies discussed herein.

In various embodiments, the machine 900 comprises multi-core processors 910, memory 930, and I/O components 950, which can be configured to communicate with each other via a bus 902. In an example embodiment, the multi-core processors 910 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another processor, or any suitable combination thereof) include, for example, an independent processor 912 and an independent processor 914 that may execute the instructions 916. The term "processor" is intended to include multi-core processors 910 that may comprise two or more independent processors 912, 914 (also referred to as "cores") that can execute the instructions 916 contemporaneously. Although FIG. 9 shows multiple multi-core processors 910, the machine 900 may include a single independent processor 912 with a single core, a single processor 912 with multiple cores (e.g., a multi-core processor 912), multiple processors 910 with a single core, multiple processors 910 with multiples cores, or any combination thereof.

The memory 930 comprises a main memory 932, a static memory 934, and a storage unit 936 accessible to the multi-core processors 910 via the bus 902, according to some embodiments. The storage unit 936 can include a machine-readable medium 938 on which are stored the instructions 916 embodying any one or more of the methodologies or functions described herein. The instructions 916 can also reside, completely or at least partially, within the main memory 932, within the static memory 934, within at least one of the multi-core processors 910 (e.g., within the processor's cache memory), or any suitable combination thereof, during execution thereof by the machine 900. Accordingly, in various embodiments, the main memory 932, the static memory 934, and the multi-core processors 910 are considered machine-readable media 938.

As used herein, the term "memory" refers to a machine-readable medium 938 able to store data temporarily or permanently and may be taken to include, but not be limited to, random-access memory (RAM), read-only memory (ROM), buffer memory, flash memory, and cache memory. While the machine-readable medium 938 is shown, in an example embodiment, to be a single medium, the term "machine-readable medium" should be taken to include a single medium or multiple media (e.g., a centralized or distributed database, or associated caches and servers) able to store the instructions 916. The term "machine-readable medium" shall also be taken to include any medium, or combination of multiple media, that is capable of storing instructions (e.g., the instructions 916) for execution by a machine (e.g., the machine 900), such that the instructions, when executed by one or more processors of the machine (e.g., the multi-core processors 910), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 950 include a wide variety of components to receive input, provide output, produce output, transmit information, exchange information, capture measurements, and so on. In general, it will be appreciated that the I/O components 950 can include many other components that are not shown in FIG. 9. The I/O components 950 are grouped according to functionality merely for simplifying the following discussion, and the grouping is in no way limiting. In various example embodiments, the I/O components 950 include output components 952, input components 954, and biometric components 956. The output components 952 include visual components (e.g., a display such as a plasma display panel (PDP), a light-emitting diode (LED) display, a liquid crystal display (LCD), a projector, or a cathode ray tube (CRT)), acoustic components (e.g., speakers), haptic components (e.g., a vibratory motor), other signal generators, and so forth. The input components 954 include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or other pointing instruments), tactile input components (e.g., a physical button, a touch screen that provides location and force of touches or touch gestures, or other tactile input components), audio input components (e.g., a microphone), and the like.

In some embodiments, outputs from an EDA computing device may include design documents, files for additional steps in a design phase 110, or outputs for circuit fabrication. In various embodiments, outputs of a timing analysis are used to generate updates and changes to a circuit design, and after a final closure of timing with all associated timing thresholds and design requirements met, circuit design output files are used to generate masks and other physical outputs for generation of a circuit. As described herein, "requirements," "design elements," and other aspects of a circuit design refer to selectable values that are set as part of the design of a circuit. Such design requirements or elements may be adjusted by a system operator or circuit designer to suit the particular goals of a project or circuit that results from the operations described herein.

Communication can be implemented using a wide variety of technologies. The I/O components 950 may include communication components 964 operable to couple the machine 900 to a network 980 or devices 970 via a coupling 982 and a coupling 972, respectively. For example, the communication components 964 include a network interface component or another suitable device to interface with the network 980. In further examples, the communication components 964 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 970 may be another machine or any of a wide variety of peripheral devices (e.g., a peripheral device coupled via a USB).

Transmission Medium

In various example embodiments, one or more portions of the network 980 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 980 or a portion of the network 980 may include a wireless or cellular network, and the coupling 982 may be a Code Division Multiple Access (CDMA) connection, a Global System for Mobile communications (GSM) connection, or another type of cellular or wireless coupling. In this example, the coupling 982 can implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High-speed Packet Access (HSPA), Worldwide Interoperability for Microwave Access (WiMAX), Long-Term Evolution (LTE) standard, others defined by various standard-setting organizations, other long-range protocols, or other data transfer technology.

Furthermore, the machine-readable medium 938 is non-transitory (in other words, not having any transitory signals) in that it does not embody a propagating signal. However, labeling the machine-readable medium 938 "non-transitory" should not be construed to mean that the machine-readable medium 938 is incapable of movement; the machine-readable medium 938 should be considered as being transportable from one physical location to another. Additionally, since the machine-readable medium 938 is tangible, the machine-readable medium 938 may be considered to be a machine-readable device.

Language

Throughout this specification, plural instances may implement components, operations, or structures described as a single instance. Although individual operations of one or more methods are illustrated and described as separate operations, one or more of the individual operations may be performed concurrently, and the operations may be performed in an order that differs from the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, techniques, instruction sequences, and computing machine program products that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A method comprising:
   accessing, by one or more hardware processors, design data for a circuit design stored in a memory, the circuit design comprising a plurality of machine regions;
   accessing, by the one or more hardware processors, a set of functional simulation data comprising test bench data for functional simulation and functional verification of the circuit design;
   accessing, by the one or more hardware processors, a set of fault simulation data, the set of fault simulation data comprising a plurality of fault data for a plurality of faults to be analyzed during fault simulation;
   selecting, by the one or more hardware processors, the plurality of faults for injection into a co-simulator;
   selecting, by the one or more hardware processors, a set of strobe detection points for the circuit design associated with fault detection for the plurality of faults;
   initiating, by the one or more hardware processors, functional simulation of the circuit design using the design data and the set of functional simulation data for a first machine region of the plurality of machine regions, wherein the first machine region is associated with at least a first fault of the plurality of faults;
   computing, by the one or more hardware processors, a fault injection simulation for the first fault as a difference between an associated functional simulation of the first machine region without the first fault and an associated fault simulation of the first machine region with the first fault, the computing the fault injection simulation comprising identifying, by a concurrent analysis engine, one or more divergence points associated with the first fault to perform the associated functional simulation and the associated fault simulation; and
   outputting, by the one or more hardware processors, a functional safety result for the fault injection simulation for the first fault.

2. The method of claim 1, wherein a co-simulation event scheduler for the fault injection simulation comprises:
   a functional queue comprising a corresponding functional analysis queue event for one or more machine regions of the plurality of machine regions; and
   a fault queue comprising a corresponding fault analysis queue event for one or more faults of the plurality of faults.

3. The method of claim 2, wherein the fault queue of the co-simulation event scheduler schedules the corresponding fault analysis queue event immediately after processing the corresponding functional analysis queue event for a corresponding machine region associated with a corresponding fault.

4. The method of claim 2, wherein the fault queue comprises a set of blocking events for a dependent machine region that is scheduled following a set of dependency events; and
   wherein the fault queue comprises a set of non-blocking assignment (NBA) events.

5. The method of claim 2, wherein the associated functional simulation generates a first fault analysis queue event for the fault queue.

6. The method of claim 2, wherein a fault engine independent of the functional queue schedules the plurality of faults for injection into the co-simulator by generating the corresponding fault analysis queue event for each fault of the plurality of faults.

7. The method of claim 1, wherein the concurrent analysis engine comprises a gate emulator and a register transfer level (RTL) emulator for computing the fault injection simulation from the one or more divergence points.

8. The method of claim 2, further comprising:
analyzing the set of fault simulation data to identify one or more not simulatable faults;
excluding the one or more not simulatable faults from the plurality of faults; and
outputting the functional safety result with a list of the one or more not simulatable faults.

9. The method of claim 1, further comprising:
for each fault of the plurality of faults, identifying a corresponding machine region of the plurality of machine regions associated with a corresponding fault; and
for said each fault, computing a corresponding fault injection simulation associated with the corresponding fault of said each fault of the plurality of faults, wherein the corresponding fault injection simulation is computed as a difference between a corresponding functional simulation for the corresponding machine region without the corresponding fault and a corresponding fault simulation of the corresponding machine region with the corresponding fault.

10. The method of claim 1, wherein the functional safety result comprises strobe data collected at the set of strobe detection points during the fault injection simulation.

11. The method of claim 1, further comprising updating the test bench data with reactive test bench data from the functional safety result; and
scheduling a set of reactive faults based on the reactive test bench data.

12. The method of claim 1, further comprising:
updating the circuit design based on the functional safety result; and
initiating fabrication of the circuit design as updated based on the functional safety result.

13. A device comprising:
a memory storing simulation data for a circuit design, the circuit design comprising a plurality of machine regions;
one or more processors coupled to the memory and configured for operations of co-simulation functional analysis and fault analysis of the circuit design, the operations comprising:
selecting a plurality of faults from the simulation data for injection into a co-simulator;
initiating functional simulation of the plurality of machine regions using the simulation data;
identifying a first machine region, the first machine region associated with at least a first fault of the plurality of faults; and
computing a fault injection simulation for the first fault as a difference between an associated functional simulation of the first machine region without the first fault and an associated fault simulation of the first machine region with the first fault; and
a concurrent engine implemented by the one or more processors, the concurrent engine configured to perform operations comprising:
identifying divergence points associated with the first fault and the first machine region; and
performing the associated functional simulation and the associated fault simulation using the divergence points.

14. The device of claim 13, further comprising an event scheduler implemented by the one or more processors, the event scheduler comprising:
a functional queue comprising a corresponding functional analysis queue event for the plurality of machine regions; and
a fault queue comprising a corresponding fault analysis queue event for each fault of the plurality of faults.

15. The device of claim 14, further comprising a fault engine implemented by the one or more processors, the fault engine configured to perform operations comprising:
identifying one or more non-simulatable faults from the simulation data;
configuring one or more strobe detection points associated with fault detection for the plurality of faults; and
generating one or more fault analysis queue events for the fault queue of the event scheduler.

16. A non-transitory computer-readable storage medium comprising instructions that, when executed by one or more processors of a device, cause the device to perform operations comprising:
accessing design data for a circuit design stored in a memory, the circuit design comprising a plurality of machine regions;
accessing a set of functional simulation data comprising test bench data for functional simulation and functional verification of the circuit design;
accessing a set of fault simulation data, the set of fault simulation data comprising a plurality of fault data for a plurality of faults to be analyzed during fault simulation;
selecting the plurality of faults for injection into a co-simulator;
selecting a set of strobe detection points for the circuit design associated with fault detection for the plurality of faults;
initiating functional simulation of the circuit design using the design data and the set of functional simulation data for a first machine region of the plurality of machine regions, wherein the first machine region is associated with at least a first fault of the plurality of faults;
computing a fault injection simulation for the first fault as a difference between an associated functional simulation of the first machine region without the first fault and an associated fault simulation of the first machine region with the first fault, the computing the fault injection simulation comprising identifying, by a concurrent analysis engine, one or more divergence points associated with the first fault to perform the associated functional simulation and the associated fault simulation; and
outputting a functional safety result for the fault injection simulation for the first fault.

17. The non-transitory computer-readable storage medium of claim 16, wherein a co-simulation event scheduler for the fault injection simulation comprises:
a functional queue comprising a corresponding functional analysis queue event for one or more machine regions of the plurality of machine regions; and
a fault queue comprising a corresponding fault analysis queue event for one or more faults of the plurality of faults.

18. The non-transitory computer-readable storage medium of claim 17, wherein the fault queue of the co-simulation event scheduler schedules the corresponding fault analysis queue event immediately after processing the corresponding functional analysis queue event for a corresponding machine region associated with a corresponding fault.

19. The non-transitory computer-readable storage medium of claim 17, wherein the fault queue comprises a set of blocking events for a dependent machine region that is scheduled following a set of dependency events; and
wherein the fault queue comprises a set of non-blocking assignment (NBA) events.

20. The non-transitory computer-readable storage medium of claim 17, wherein a fault engine independent of the functional queue schedules the plurality of faults for injection into the co-simulator by generating the corresponding fault analysis queue event for each fault of the plurality of faults.

* * * * *